United States Patent
Klaus et al.

(10) Patent No.: US 10,186,858 B2
(45) Date of Patent: Jan. 22, 2019

(54) DEVICE FOR A CURRENT LIMITER AND A CURRENT LIMITER COMPRISING SAID DEVICE

(71) Applicant: ROLLS-ROYCE PLC, London (GB)

(72) Inventors: David William Klaus, Leeds (GB); Adrian Wilson, Newcastle Upon Tyne (GB)

(73) Assignee: ROLLS-ROYCE PLC, London (GB)

( * ) Notice: Subject to any disclaimer, the term of this patent is extended or adjusted under 35 U.S.C. 154(b) by 376 days.

(21) Appl. No.: 14/911,969

(22) PCT Filed: Aug. 15, 2014

(86) PCT No.: PCT/EP2014/067485
§ 371 (c)(1),
(2) Date: Feb. 12, 2016

(87) PCT Pub. No.: WO2015/022423
PCT Pub. Date: Feb. 19, 2015

(65) Prior Publication Data
US 2016/0197471 A1 Jul. 7, 2016

(30) Foreign Application Priority Data
Aug. 16, 2013 (EP) .................................. 13180660

(51) Int. Cl.
H02H 9/02 (2006.01)
H01F 6/00 (2006.01)
H01L 39/16 (2006.01)

(52) U.S. Cl.
CPC ............... *H02H 9/023* (2013.01); *H01F 6/00* (2013.01); *H01L 39/16* (2013.01); *H01F 2006/001* (2013.01)

(58) Field of Classification Search
USPC .......................................................... 361/19
See application file for complete search history.

(56) References Cited

U.S. PATENT DOCUMENTS 3,443,255 A 5/1969 Massar
5,739,997 A * 4/1998 Gross .................. G01R 33/288
335/216
(Continued)

FOREIGN PATENT DOCUMENTS

CN 101730963 A 6/2010
EP 0 350 916 A2 1/1990
(Continued)

OTHER PUBLICATIONS

Office Action issued in corresponding Chinese Patent Application, dated Feb. 16, 2017 (11 pages).
(Continued)

*Primary Examiner* — Ronald W Leja
(74) *Attorney, Agent, or Firm* — Oliff PLC (57) ABSTRACT

A device (10) for a current limiter is described, the device (10) comprising: at least one coil assembly (12) adapted to carry a current, the coil assembly (12) comprising: a first coil (14), comprising a first superconducting element, adapted to carry a first portion of said current, and a second coil (16), comprising a second superconducting element, adapted to carry a second portion of said current, wherein said first and second coils (14, 16) are arranged such that, when said first and second superconducting elements are each in a superconducting state and said coil assembly (12) carries said current, a magnetic field generated by said first portion of said current in said first coil (14) is substantially cancelled by a magnetic field generated by said second portion of said current in said second coil (16); and wherein said device is adapted such that, in use, the first superconducting element carries a higher proportion of said current than the second superconducting element. The device may be used in a superconducting fault current limiter to provide a low induc- (Continued)

tance during normal operation and a rapid and even quench under fault current conditions.

19 Claims, 3 Drawing Sheets

(56) References Cited

U.S. PATENT DOCUMENTS

| | | | |
|---|---|---|---|
| 5,892,644 A * | 4/1999 | Evans | H01F 6/00 |
| | | | 361/19 |
| 6,337,785 B1 | 1/2002 | Okazaki | |
| 2005/0018368 A1* | 1/2005 | Ko | H02H 9/023 |
| | | | 361/19 |
| 2005/0153843 A1* | 7/2005 | Kubota | H01L 39/16 |
| | | | 505/100 |
| 2006/0268471 A1* | 11/2006 | Lee | H01F 6/06 |
| | | | 361/19 |
| 2009/0190274 A1 | 7/2009 | Ko et al. | |
| 2014/0100113 A1* | 4/2014 | Stautner | H01F 6/04 |
| | | | 505/163 |

FOREIGN PATENT DOCUMENTS

| | | |
|---|---|---|
| EP | 2 472 532 A1 | 7/2012 |
| WO | 2009/006666 A1 | 1/2009 |

OTHER PUBLICATIONS

International Search Report issued in PCT/EP2014/067485 dated Nov. 6, 2014 (3 pages).

* cited by examiner

DEVICE FOR A CURRENT LIMITER AND A CURRENT LIMITER COMPRISING SAID DEVICE

FIELD OF THE INVENTION

The present invention relates to devices for current limiters and current limiters including such devices, and relates particularly but not exclusively to fault current limiters utilising superconducting circuits maintained at a low temperature.

BACKGROUND OF THE INVENTION

Fault-current limiters have been implemented using superconducting material to carry the current in an electricity supply network. Such networks normally are expected to carry currents of a few hundred amperes, but if a short-circuit (fault) occurs, the current rises to levels which can be several tens of thousands of amperes. When a fault occurs, the current density in the superconducting material exceeds the critical current density of the material, which ceases to be superconducting and becomes resistive. This process is known as quenching. The presence of resistance in the circuit causes the current to be reduced, or "limited", reducing the potentially damaging effects of excessively high currents in the network.

Networks for the transmission and distribution of electricity are generally three-phase, so three conductors are required and for each of said three conductors, current-limiting means must be provided. Typically a superconducting fault-current limiter will comprise three current limiters as described above, housed either in a single vessel or in a plurality of vessels.

Some types of superconducting fault current limiters employ a superconducting element together with a semiconductor switching element (and associated circuit elements), which switches the state of the limiter between normal and fault conditions. Others require an iron core magentically linking several superconducting coils. It is known to provide a device for a current limiter, the device comprising at least one coil assembly adapted to carry a current, the coil assembly comprising a first coil, comprising a first superconducting element, adapted to carry a first portion of said current, and a second coil, comprising a second superconducting element, adapted to carry a second portion of said current, wherein said first and second coils are arranged such that, when said first and second superconducting elements are each in a superconducting state and said coil assembly carries said current, a magnetic field generated by said first portion of said current in said first coil is substantially cancelled by a magnetic field generated by said second portion of said current in said second coil.

Examples of this type are disclosed in EP0350916 (U.S. Pat. No. 5,021,914) and WO 2012/093042 (the contents of the latter being incorporated herein by reference).

U.S. Pat. No. 6,337,785 and US2009190274 (granted as U.S. Pat. No. 7,675,719) teach devices in which the first and second superconducting elements have different "quench characteristics" so that one superconducting element has a lower critical current than the other. This is achieved by use of two different superconducting materials for the respective two superconducting elements. US2009190274 employs a semiconductor switch to guarantee the change of state. In the case of U.S. Pat. No. 6,337,785, the two coils are arranged in series and, in the superconducting state, therefore pass the same current, but when a first coil quenches, current routes instead through a parallel shunt resistor, causing a rapid net impedance due to the second coil. This provides a rapid transition of the superconducting elements from the superconducting to the normal state (quenching) when fault current begins to flow, without needing a separate switch element or an iron core. The device may therefore be used in a superconducting fault current limiter to provide a low inductance during normal operation and a rapid quench under fault current conditions.

However, use of different materials complicates the manufacturing process, and limits the materials choices open to the circuit designer. Preferred embodiments of the present invention seek to overcome one or more of the above disadvantages of the prior art.

SUMMARY OF THE INVENTION

According to a first aspect of the invention, there is provided a device of the above type, wherein said device is adapted such that, in use, the first superconducting element carries a higher proportion of said current than the second superconducting element. By being adapted such that, in use in the superconducting state, the first superconducting element carries a higher proportion of the total current than is carried by the second superconducting element for undergoing a transition from a superconducting state to a normally conducting state, the device of the present invention provides the advantage of a rapid and even transition of the superconducting elements from the superconducting to the normal state (quenching) when fault current begins to flow. This is important for avoiding the problem of a "partial" quench, which is most likely to occur when the current is only just above the critical current and can lead to burn out in a portion of the superconducting element which quenches first. This is conveniently arranged by providing the devices in parallel rather than in series, so that the currents to them can be independently predetermined.

The device may therefore be used in a superconducting fault current limiter to provide a low inductance during normal operation and a rapid and even quench under fault current conditions, without requiring additional components such as semiconductor switches or shunt resistors.

By carrying a higher proportion of the total current, the first superconducting element will become normally conducting, and therefore resistive, when the current carried by the coil assembly rises above the critical current of the first superconducting element, while the second superconducting element initially remains superconducting. This will cause the proportion of the current passing through the second coil to increase, such that the magnetic fields generated by the first and second coils no longer cancel. As a result, the magnitude of the magnetic flux density in the vicinity of the superconducting elements rises rapidly, which causes the quench of the superconducting elements from the superconducting state to the normally conducting state to proceed more rapidly.

This aspect of the present invention thus arises from the inventors' realisation that increasing the current to the first coil can cause that coil to switch state before the other, in the same manner as decreasing its critical current would—in each case, the fault current reaches the critical current level in the first coil before it does so in the second coil. However, this aspect has the further advantage that the first and second superconducting elements can be made from the same material, thereby simplifying manufacture and reducing cost, as well as increasing the choice of materials to the designer.

In a preferred embodiment, the first and second coils are overlapping helical coils wound in opposite senses about a common axis. The first and second coils may have substantially the same length, but (unlike the prior art, in which the two coils are selected to be identical), the first coil may have a smaller number of turns (typically in the range 10 to 30% fewer turns) than the second coil. It is found that this permits the magnetic fields to substantially cancel each other with the coils in the superconducting state, whilst increasing the share of current to the first coil. However, other methods of varying the current distribution (for example by providing additional different circuit components associated with the two coils) could equally be employed.

Whilst it is sufficient, in some cases, to provide that the first superconducting element carries a higher proportion of said current than the second superconducting element, it may in some cases be desirable to enhance the speed of the quench, or reduce the difference in current required, by providing also that the first superconducting element has a lower critical current than the second superconducting element.

In some embodiments, this can be achieved by providing that the first superconducting element has a lower critical current density than the second superconducting element. In some embodiments, the first superconducting element has a smaller cross-sectional area than the second superconducting element. For example, if superconducting elements having similar critical current densities are used, reducing the cross-sectional area of the first superconducting element will reduce its critical current.

However, in each of these cases, it is necessary to use different superconducting coils (different material and/or different dimensions). Accordingly, in a further aspect of the invention, a device of the above prior art type is adapted such that, when said first and second coils are thermally coupled to cooling means for cooling the first and second superconducting elements below their critical temperatures, said first and second superconducting elements are maintained at different temperatures. Like the first aspect, this aspect allows the same materials to be employed for both coils, with the same length and number of coils, whilst ensuring that the current in the first coil exceeds its critical current before that in the second coil.

Advantageously, this feature can be used to ensure that the first superconducting element has a lower critical current than the second superconducting element, since the critical current depends to some extent on temperature.

The device may further comprise thermal coupling means for thermally coupling said first and second coils to cooling means for cooling said first and second superconducting elements to temperatures below their critical temperatures for superconductivity; wherein said thermal coupling means provides weaker thermal coupling to said first coil than to said second coil.

This feature may be used to ensure that the first and second superconducting elements are maintained at different temperatures, since heating caused by AC losses in the superconducting elements will lead to a higher temperature for the first coil which is in weaker thermal contact with the cooling means. This aspect of the invention may be used with the first aspect, to enhance the speed of the quench, or reduce the difference in current or temperature required.

The first and second coils may be supported on a former adapted to thermally couple the first and second coils to said cooling means, wherein the second coil is wound around the former, and the first coil is wound around the former and the second coil.

This feature can be used to reduce the thermal coupling between the first coil and the former, relative to that between the second coil and the former, to thereby increase the temperature of the first coil relative to that of the second coil.

The device may further comprise means for heating said second coil.

In some embodiments, the coil assembly further comprises a former for supporting said first and second coils, wherein said former is adapted to thermally couple said first and second coils to cooling means for cooling said first and second superconducting elements to temperatures below their critical temperatures.

Preferably, the first coil is wound around the former, and the second coil is wound around the former and the first coil.

Advantageously, this feature enables the temperature and therefore the critical current of the first superconducting element, which depends to some extent on its temperature, to be more accurately defined and/or controlled, since it improves the thermal contact between the first coil and the former and thus the cooling means. Importantly, this enables more accurate control over the level of the fault current which will trigger quenching and thus initiate current limiting. This current level is preferably set according to specific application.

In some embodiments, the device may further comprise a plurality of said coil assemblies, wherein said first coils of said coil assemblies are connected in series, said second coils of said coil assemblies are connected in series, and said series-connected first coils are connected in parallel with said series-connected second coils.

By providing a plurality of coil assemblies, the device can be adapted for operation at higher voltage levels. By connecting the first and second coils respectively in series as defined above, a high current will continue to flow through the second coils when one or more of the first coils starts to quench under fault current conditions, for long enough to rapidly increase the magnetic field around the superconducting elements and drive a rapid and even quench of all the superconducting elements.

According to a third aspect of the invention, there is provided a current limiter comprising at least one device as defined above, and further comprising cooling means for cooling said first and second superconducting elements to temperatures below their critical temperatures for superconductivity.

According to a fourth aspect of the invention, there is provided a current limiter comprising a plurality of devices as defined above, for limiting current in a respective plurality of phases of a polyphase electrical supply.

BRIEF DESCRIPTION OF THE DRAWINGS

Preferred embodiments of the present invention will now be described, by way of example only and not in any limitative sense, with reference to the accompanying drawings, in which.

DETAILED DESCRIPTION OF EMBODIMENTS

First Embodiment

Figure 1:
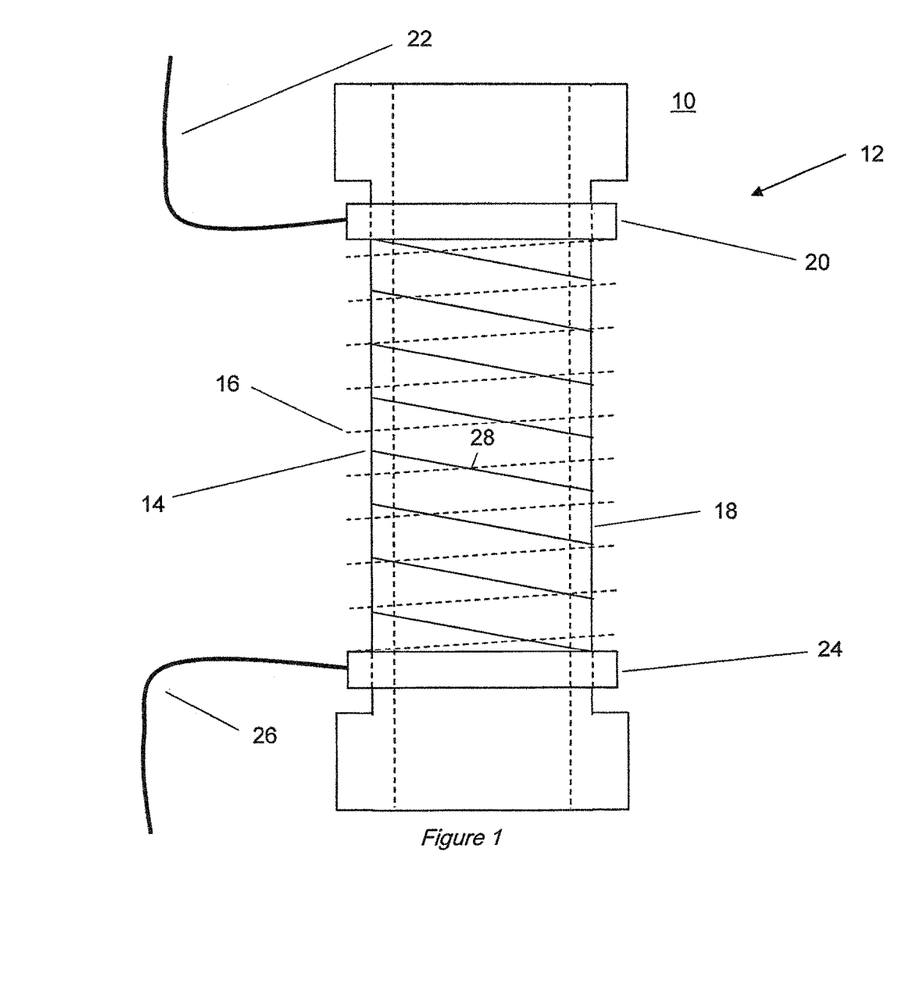
FIG. 1 illustrates a device according to a first embodiment of the invention.

With reference to FIG. 1, a device 10 according to a first embodiment of the invention comprises coil assembly 12 adapted to carry a current. The coil assembly 12 comprises two coils 14, 16, each comprising a superconducting element, connected in parallel such that each coil 14, 16 carries a portion of the current through the coil assembly 12. The two coils 14, 16 are arranged such that, when the superconducting elements of the coils 14, 16 are each in a superconducting state with a current flowing through the coil assembly 12, the magnetic fields generated by the two coils 14, 16 substantially cancel each other. In this embodiment, this is achieved by arranging the coils 14, 16 as two concentric, preferably coaxial helical coils 14, 16, having a similar diameter and length, connected in parallel and wound in opposition so that the currents in the two coils 14, 16, flow around the axis of the coils in opposite rotational senses. This reduces the magnetic flux density in the region of the coil assembly 12, thereby reducing AC losses. Ideally, the two coils 14, 16 should be designed to provide the lowest possible inductance at the operating frequency (typically 50 Hz or 60 Hz) and this may be achieved by ensuring close magnetic coupling between the coils by making their diameters and lengths as near identical as is physically possible. The inductance of the two coils is not affected greatly by arranging for the first coil 14 to have fewer turns (typically in the range 10 to 30%) than the second coil 16.

The superconducting elements used for the coils may be formed of any suitable superconducting material, for example magnesium diboride, and may be provided in any suitable form, for example a tape, wire, or multi-strand (e.g. plaited multifilamentary) or multi-core arrangement.

The two coils 14, 16 are wound around the outside of an electrically-insulating cylindrical former 18 provided with a first end electrode 20 connected to a first external connection 22. The two coils 14, 16 are each connected at one end to the first end electrode 20. A second end electrode 24 is connected to the other ends of two coils 14, 16. A second external connection 26 is connected to second end electrode 24. Electrical insulation is provided to prevent electrical contact between the two coils 14, 16 at points 28 where the two coils 14, 16 cross.

When the device 10 is incorporated in a fault current limiter, the former 18 may be used to thermally couple the coils 14, 16 to a cryocooler so that the coils 14, 16 may be cooled to temperatures below their respective critical temperatures. In this embodiment, the former 18 comprises a hollow tube formed of a material having a suitably high thermal conductivity and specific heat capacity, combined with a suitably high electrical resistivity, for example, alumina.

Above their critical temperatures, the superconducting elements of the coils 14, 16 are normally-conducting, and therefore resistive. Below their critical temperatures, the superconducting elements of the coils 14, 16 become superconducting. When cooled to a superconducting state, the coils 14, 16 effectively present a zero-resistance pathway to current flowing between the end electrodes 20, 24, provided that the current density in the superconducting elements of each coil 14, 16 remains below the respective critical current density of each superconducting element.

The current in the superconducting element used for one of the coils 14, 16 is lower than that of the superconducting element used for the other one of the coils 14, 16. This can be achieved by arranging for the two coils 14, 16 to have unequal numbers of turns, in particular by arranging the first coil to have fewer turns than the second coil such that, when said first and second superconducting elements are each in a superconducting state and said coil assembly carries said current, the mutual inductance linking the first and second coils causes said current to be shared unequally between the first and second coils such that the first coil having fewer turns carries a higher proportion of said current.

During the passage of normal load current through the coils 14, 16, the mutual inductance between the two coils 14, 16 ensures that the current is shared unequally. The currents in the two coils 14, 16 are determined partially according to the inverse ratio of the number of turns in coil 14 to the number of turns in coil 16. Good coupling between the coils assures that the magnetic fields generated by the two coils 14, 16 cancel each other almost completely. This provides the conditions required to maintain low levels of AC loss and minimises the production of heat in the coils.

At a very early stage of the current rising above a predetermined fault current level, that is to say at the very onset of a fault condition in the network, the current in the coil 14 carrying the higher current (henceforth referred to as "the first coil" 14) will exceed the critical current of the first coil 14 and the superconducting material from which the first coil 14 is wound will become resistive. This will cause more current to flow in the second coil 16 carrying the lower current (henceforth referred to as "the second coil" 16) which coil 16 remains in the superconducting state for a short time period following the quench of the first coil 14. The two coils 14, 16 during this period no longer share the current in proportion partially according to the inverse turns ratio and as a result the magnetic fields produced by the currents flowing in the two coils 14, 16 no longer cancel. This results in a net magnetic field in the region of the two coils 14, 16 which encourages a rapid transition from the superconducting state of the superconducting material of the whole assembly.

Since the first coil 14 carries the higher current, it is the first coil 14 which determines the fault current level which triggers quenching and initiates current limiting. This fault current level will be set according to the specific application, but it is important that the fault current level which triggers quenching remains constant. The critical current of the first coil 14 depends to some extent on the temperature at which the superconducting element of the first coil 14 is maintained. It is therefore preferable to wind the coil assembly 12 with the first coil 14 innermost, so that it is closest to the former 18. This improves the accuracy and stability with which the temperature, and therefore the critical current, of the first coil 14 is controlled. Cooling of the second coil 16 may be less effective since it is wound outermost on the former 18, around the first coil 14. However, accurate temperature control of the second coil 16, having the higher critical current, is less important.

The two coils in this embodiment are fed in parallel from an upstream circuit node, without series or parallel passive components such as shunt resistors, or active components such as semiconductor switches, and no iron core is required. Although additional circuit elements could be present without disrupting the operation of the device, an advantage of this embodiment is that no such elements are necessary. Reference to "components" here will be understood not to include the inevitable inherent resistance, inductance or capacitance of circuit wiring or support surfaces.

Second Embodiment

Figure 2:
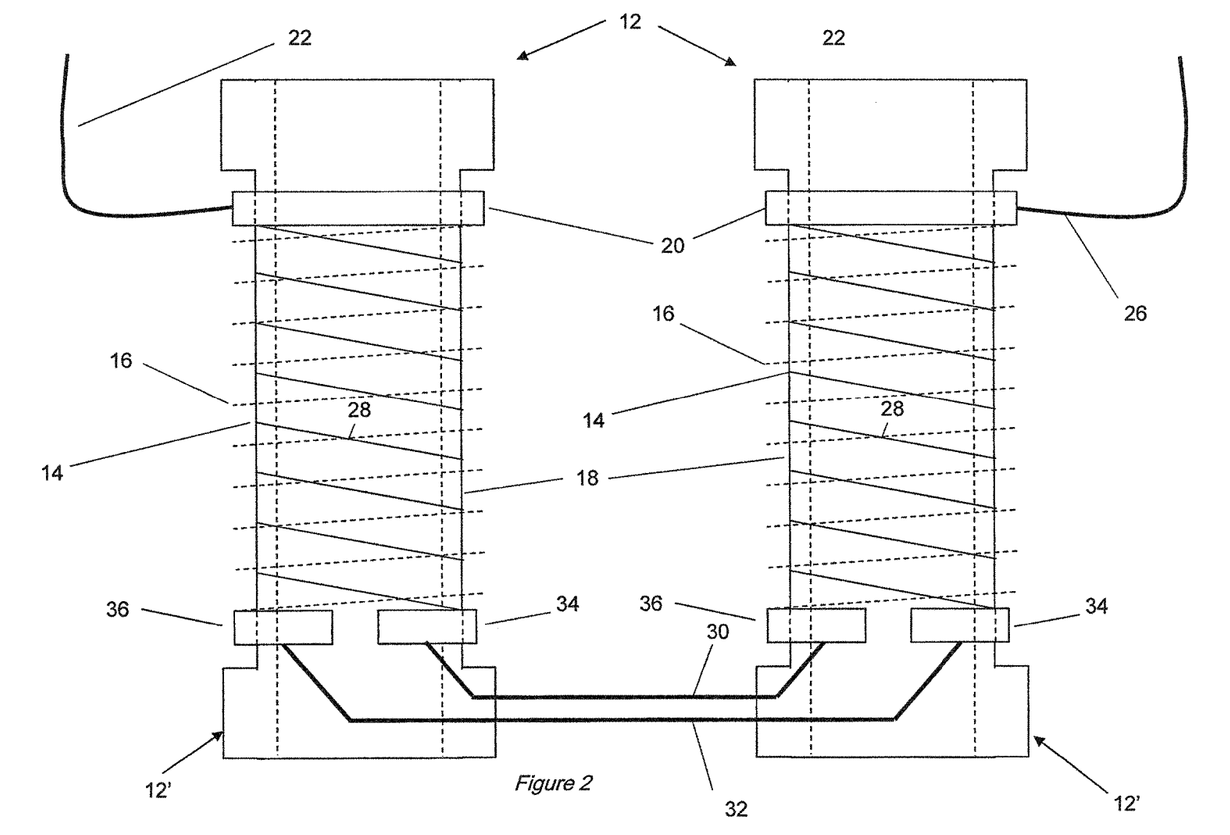
FIG. 2 illustrates a device according to a second embodiment of the invention.

With reference to FIG. 2, a device 10' according to a second embodiment of the invention comprises multiple coil assemblies 12', connected in series, for example to allow the operation of the device 10' at higher voltage levels. Components which have been described in connection with the first embodiment above are indicated by the same reference numerals. Where it is necessary to connect multiple coil assemblies 12' in series, the conducting paths through the first and second coils 14, 16 are kept separate throughout the series connected assemblies 12', by means of connecting all of the first (higher current or lower Ic) coils 14 in series, connecting all of the second (lower current or higher Ic) coils 16 in series and making the parallel connection of the two sets of series connected coils 14, 16 only at the extremities of said sets. This arrangement, applied to two series connected coil assemblies 12' is shown schematically in FIG. 2. The connections 30, 32 between the coil assemblies 12' can be made using suitable conducting or superconducting material. First end electrodes 20, connected to ends of both first and second coils 14, 16, are provided at the ends of the coil assemblies 12' connected to external connections 22, 26, as in the first embodiment. Two separate second end electrodes 34, 36 are provided to terminate the first coils 14 and second coils 16 respectively at the other ends of the coil assemblies 12' to facilitate independent series connection of the first and second coils 14, 16 of the coil assemblies 12'.

Third Embodiment

Figure 3:
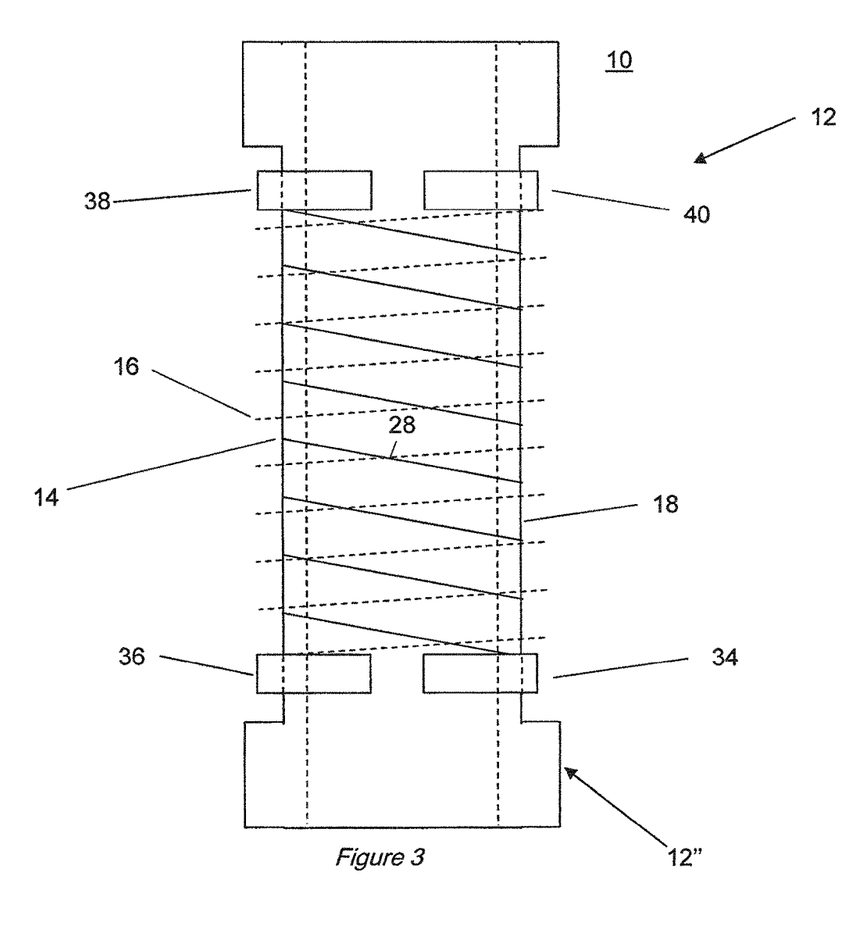
FIG. 3 illustrates a coil assembly of a device according to third embodiment of the invention.

FIG. 3 shows a further embodiment of a coil assembly 12" for connection in between the coil assemblies 12' of the second embodiment where more than two are required to be connected in series. Components which have been described in connection with the first or second embodiments above are indicated by the same reference numerals. A pair of first end electrodes 38, 40 and a pair of second end electrodes 34, 36 allow independent connection to subsequent coil assemblies 12", 12' at both ends of the coil assembly 12". To simplify manufacture, it may be desirable to construct all coil assemblies in this way and to link the end electrodes (e.g. to link end electrodes 34 and 36, or to link end electrodes 38, 40) at the extremities of the two sets of series connected coils, at the point where the external connections 22, 26 are provided.

Those skilled in the art will appreciate that this method of interconnection is provided to ensure that under any fault conditions including faults of smaller magnitude all of the superconducting material is encouraged to quench by forcing current into the second (lower current or higher Ic) coils of each coil assembly. If coil assemblies 12, terminated as shown in FIG. 1, were simply connected in series, there is a risk that one of the coil assemblies 12 would quench, limiting the current sufficiently to prevent the other assemblies 12 from also quenching. The quenched coil assembly 12 would then be required to absorb all of the energy associated with the fault limiting process and could be damaged thermally as a result of this or at least become sufficiently heated to increase the post-fault reset time of the current limiter to an unacceptable degree.

Fourth Embodiment

In the preceding embodiments, the two coils carry different currents. In a fourth embodiment, to which FIGS. 1 to 3 apply in their entirety as discussed below, switching is arranged by providing that the two coils have the same number of turns and carry the same current but the critical current Ic of the superconducting element used for one of the coils 14, 16 is lower than that of the superconducting element used for the other one of the coils 14, 16. The critical current of a superconducting element is the current above which the superconducting element will undergo a transition from a superconducting state to a normally conducting state. In the event of a fault one will quench before the other due to the rising current reaching its lower critical current first.

This can be achieved in a number of ways, as discussed below. During the passage of normal load current through the coils 14, 16, the mutual inductance between the two coils 14, 16 ensures that the current is shared almost equally and the magnetic fields generated by the two coils 14, 16 cancel each other almost completely. This provides the conditions required to maintain low levels of AC loss and minimises the production of heat in the coils.

At a very early stage of the current rising above a predetermined fault current level, that is to say at the very onset of a fault condition in the network, the current in the coil 14 having the lower critical current (henceforth referred to as "the first coil" 14) will exceed the critical current of the first coil 14 and the superconducting material from which the first coil 14 is wound will become resistive. This will cause more current to flow in the second coil 16 having the higher critical current (henceforth referred to as "the second coil" 16) which coil 16 remains in the superconducting state for a short time period following the quench of the first coil 14. The two coils 14, 16 during this period no longer share the current equally and as a result the magnetic fields produced by the currents flowing in the two coils 14, 16 no longer cancel. This results in a net magnetic field in the region of the two coils 14, 16 which encourages a rapid transition from the superconducting state of the superconducting material of the whole assembly.

Since the first coil 14 has a lower critical current, it is the first coil 14 which determines the fault current level which triggers quenching and initiates current limiting. This fault current level will be set according to the specific application, but it is important that the fault current level remains constant. The critical current of the first coil 14 depends to some extent on the temperature at which the superconducting element of the first coil 14 is maintained. It is therefore preferable to wind the coil assembly 12 with the first coil 14 innermost, so that it is closest to the former 18. This improves the accuracy and stability with which the temperature, and therefore the critical current, of the first coil 14 is controlled. Cooling of the second coil 16 may be less effective since it is wound outermost on the former 18, around the first coil 14. However, accurate temperature control of the second coil 16, having the higher critical current, is less important.

A difference in the critical currents of the superconducting elements of the first and second coils 14, 16 can be achieved in a number of ways.

For example, the superconducting elements of the two coils 14, 16 may have different cross-sectional areas. Depending on the form of the superconducting element used, different cross-sectional areas can be achieved by changing, for example, the width and/or thickness of a tape, the diameter of a wire, or the number of strands or cores in a multi-strand or multi-core arrangement.

Yet another option is to maintain the two coils 14, 16 at different temperatures, since the critical current depends on temperature. This may be achieved by adjusting the thermal coupling between each coil 14, 16 and the cooling means, for example by providing a partially thermally insulating material between the coils 14, 16 to reduce the thermal coupling of the outermost coil to the former 18. Any heating of the coils 14, 16, for example heating due to AC losses in the coils, would lead to the outer coil having a higher temperature and therefore a lower critical current. Also, a heat source (preferably a radiative heat source) could be introduced to increase the temperature of one of the coils; although every effort is normally made to keep superconducting elements cold, preferentially heating one coil (e.g. the first coil) allows it to quench sooner.

The devices and coil assemblies described above with reference to FIGS. 1 to 3 can all be used in a fault-current limiter for limiting current in one phase of a poly-phase electrical supply. The skilled person will appreciate that the superconducting paths of the above embodiments may be duplicated as necessary in a multi-phase current limiter, for example by providing multiple devices 12 in a single multi-phase current limiter.

It will be appreciated by persons skilled in the art that the above embodiments have been described by way of example only, and not in any limitative sense, and that various alterations and modifications are possible. Protection is sought for any and all novel subject-matter disclosed herein and combinations thereof. In particular, features of the different embodiments may be freely combined. The word "comprising" herein means "including" and does not exclude the presence of other elements except where expressly indicated.

The invention claimed is:

1. A device for a current limiter, the device comprising:
    at least one coil assembly adapted to carry a current, the coil assembly comprising:
    a first coil, comprising a first superconducting element, adapted to carry a first portion of said current;
    a second coil, comprising a second superconducting element, adapted to carry a second portion of said current; and
    a former for supporting said first and second coils, wherein said former is adapted to thermally couple said first and second coils to cool in means for cooling said first and second superconducting elements to temperatures below their critical temperatures,
    wherein said first and second coils are arranged such that, when said first and second superconducting elements are each in a superconducting state and said coil assembly carries said current a magnetic field generated by said first portion of said current in said first coil is substantially cancelled by a magnetic field generated by said second portion of said current in said second coil; and
    wherein said device is adapted such that, in use, the first superconducting element carries a higher proportion of said current than the second superconducting element.

2. A device according to claim 1, wherein the first superconducting element has an equal or smaller cross-sectional area than the second superconducting element.

3. A device according to claim 1, wherein said first and second coils are overlapping helical coils wound in opposite senses about a common axis.

4. A device according to claim 3, wherein said first and second coils have substantially the same length.

5. A device according to claim 3, wherein the first coil has a smaller number of turns than the second coil.

6. A device according to claim 1 in which the first and second coils are composed of the same superconducting material.

7. A device according to claim 1, wherein said first coil is wound around said former, and said second coil is wound around said former and said first coil.

8. A device according to claim 1, wherein the first superconducting element has the same or a lower critical current density than the second superconducting element.

9. A device according to claim 8, further comprising a heater.

10. A device according to claim 9 in which said heater heats said second coil.

11. A device according to claim 1, wherein said device is adapted such that, when said first and second coils are thermally coupled to said cooling means for cooling the first and second superconducting elements below their critical temperatures, said first and second superconducting elements are maintained at different temperatures.

12. A device according to claim 1, further comprising said former for thermally coupling said first and second coils to said cooling means for cooling said first and second superconducting elements to temperatures below their critical temperatures for superconductivity;
    wherein said former provides weaker thermal coupling to said first coil than to said second coil.

13. A device according to claim 1, wherein said first coil is connected in parallel with said second coil.

14. A device according to claim 13, which does not comprise any passive or active electronic components in parallel with the coils.

15. A device according to claim 13 comprising a plurality of said coil assemblies, wherein:
    said first coils of said coil assemblies are connected in series,
    said second coils of said coil assemblies are connected in series, and
    said series-connected first coils are connected in parallel with said series-connected second coils.

16. A current limiter comprising at least one device according to claim 1, and further said cooling means comprising a cooling device for cooling said first and second superconducting elements to temperatures below their critical temperatures for superconductivity.

17. A current limiter, comprising a plurality of devices according to claim 1, arranged to limit current in a respective plurality of phases of a polyphase electrical supply.

18. A device for a current limiter, the device comprising:
    at least one coil assembly adapted to carry a current, the coil assembly comprising:
    a first coil, comprising a first superconducting element, adapted to carry a first portion of said current;
    a second coil, comprising a second superconducting element adapted to carry a second portion of said current; and
    cooling means for cooling the first and second superconducting elements below their critical temperatures,
    wherein said first and second coils are arranged such that when said first and second superconducting elements are each in a superconducting state and said coil assembly carries said current, a magnetic field generated by said first portion of said current in said first coil is substantially cancelled by a magnetic field generated by said second portion of said current in said second coil;
    wherein said coil assembly further comprises a former for supporting said first and second coils, said former being adapted to thermally couple said first and second coils to said cooling means; and
    wherein said device is adapted such that, in use, when said first and second coils are thermally coupled to said cooling means, said first and second superconducting elements are maintained at different temperatures so that the first superconducting element has a lower critical current than the second superconducting element for undergoing a transition from a superconducting state to a normally conducting state.

19. A device for a current limiter, the device comprising:
at least one coil assembly adapted to carry a current, the coil assembly comprising:
a first coil, comprising a first superconducting element, adapted to carry a first portion of said current;
a second coil, comprising a second superconducting element, adapted to carry a second portion of said current; and
a former for supporting said first and second coils, wherein said former is adapted to thermally couple said first and second coils to cooling means for cooling said first and second superconducting elements to temperatures below their critical temperatures,
the first superconducting element having a smaller cross-sectional area than the second superconducting element,
wherein, in use, the first superconducting element has a lower critical current than the second superconducting element for undergoing a transition from a superconducting state to a normally conducting state.

* * * * *